United States Patent [19]

Schmidt et al.

[11] 4,358,331

[45] Nov. 9, 1982

[54] METHOD OF EMBEDDING SEMICONDUCTOR COMPONENTS IN PLASTICS

[75] Inventors: Eckehard Schmidt; Dieter Rüsch, both of Wedel; Manfred Tauber, Holm, all of Fed. Rep. of Germany

[73] Assignee: Licentia Patent-Verwaltungs-G.m.b.H., Frankfurt am Main, Fed. Rep. of Germany

[21] Appl. No.: 127,422

[22] Filed: Mar. 5, 1980

[30] Foreign Application Priority Data

Mar. 5, 1979 [DE] Fed. Rep. of Germany ....... 2908485

[51] Int. Cl.$^3$ ...................... B29C 25/00; B29C 27/00
[52] U.S. Cl. .............................. 156/275.5; 156/275.7; 156/298; 156/303.1; 156/307.3; 264/272.11; 264/272.13; 264/272.14; 264/272.17
[58] Field of Search .................. 156/272, 275.5, 275.7, 156/298, 303.1, 307.1, 307.3; 264/272.11, 272.17, 272.13, 272.14, 279.1

[56] References Cited

U.S. PATENT DOCUMENTS

| | | | |
|---|---|---|---|
| 3,081,244 | 3/1963 | Campanile | 156/272 |
| 3,644,161 | 2/1972 | Hall | 156/272 |
| 3,697,351 | 10/1972 | Harmer et al. | 156/272 |
| 4,268,339 | 5/1981 | Urban | 156/275.5 |

FOREIGN PATENT DOCUMENTS 2445642  4/1976  Fed. Rep. of Germany .

OTHER PUBLICATIONS

Kunstoffhandbuch (Manual of Plastics), vol. I, Hanser-Verlag, Wien, (1975), pp. 1164–1165.
SPI Plastics Engineering Handbook, 4th Edition, Van Nostrand Reinhold Co., New York, (1976), pp. 600–605.

*Primary Examiner*—Michael G. Wityshyn
*Attorney, Agent, or Firm*—Spencer & Kaye

[57] ABSTRACT

A method of embedding semiconductor components in plastics comprising inserting components into the plastics material and thereafter hardening the plastics material by irradiation with high energy beams.

5 Claims, No Drawings

METHOD OF EMBEDDING SEMICONDUCTOR COMPONENTS IN PLASTICS

BACKGROUND OF THE INVENTION

The invention relates to a method of embedding semiconductor components in plastics.

The use of semiconductor components, for example solar cells, usually requires them to be surrounded on all sides by a material which is resistant to weathering. Certain plastics such as glass-reinforced epoxy resins or polyesters are suitable for this purpose.

A terrestrial solar cell generator is known from German Offenlegungsschrift No. 24 45 642 (published Sept. 25, 1974), in which the solar cells are protected from damaging environmental effects by the fact that the solar cells and their connection elements are surrounded on all sides by a single material. The use of a glass-fibre-reinforced plastic, a thermoplastic or glass is provided for as this material.

Many previously known arrangements have insufficient weathering characteristics. In particular cracking due to tension in the surface of the plasics, delamination i.e. peeling away or erosion between the semiconductor components and the plastics layer as well as degradation of the transparency of the plastics, may occur, for example. These poor weathering characteristics are one of the results of the manufacture of thin layers of plastic using chemical agents, since the plastics resins used require a high percentage of hardeners and/or accelerators in order to achieve complete hardening of the plastics.

SUMMARY OF THE INVENTION

It is an object of the invention to provide a method of embedding semiconductor components in plastics in which the above-described damage which may occur in the known arrangements is avoided and adequate weathering characteristics can be ensured.

According to the invention, there is provided a method of embedding semiconductor components in plastics comprising inserting the semiconductor components into the plastic material and thereafter hardening the plastic layer surrounding the semiconductor components by irradiation with high energy beams.

DESCRIPTION OF THE PREFERRED EMBODIMENTS

In a method of embedding semiconductor components such as solar cells in plastic material, the plastic material surrounding the semiconductor components is hardened after insertion of the components by irradiation with high energy beams.

In addition to the relatively short hardening time which can be achieved and which makes immediate further processing of the arrangement possible and promotes rational/continuous manufacture, one advantage of the invention lies in the possibility of manufacturing and hardening thin plastic layers without the addition of reaction products such as peroxide. Definite hardening may take place in relation to the degree and the time, i.e. no re-hardening or setting of the residual monomer content is provided for during the weathering phase. Cracking in the surface of the plastics due to tension is avoided. A further advantage lies in the improvement in bonding between the semiconductor components and the plastic layer due to electron radiation. Bonding may be further improved by the introduction of a bonding agent between the semiconductor components and the plastic layer, so that the layer of bonding agent may also be irradiated with high-energy beams.

The thickness of the hardened plastic layer and/or of the hardened layer of bonding agent is set specifically by metering the energy of the beam as a function of the physical properties of the high-energy beams. Thus it is possible for example, that in the case where polyester is being used with an irradiation dose of approximately 15–20 Mrad, the surface becomes extremely hard while at the same time at the side and towards the semiconductor component a lesser degree of hardening takes place due to the residual dose of approximately 10–12 Mrad. Thus the differing coefficients of expansion between the semiconductor component and the plastic layer may be matched to each other.

The degree of hardening may be set specifically as a function of the layer thickness of the plastic material as well as the enery of the beam.

It will be understood that the above description of the present invention is susceptible to various modifications changes and adaptions.

We claim:

1. A method of embedding semiconductor solar cells in plastic, characterized in that the plastic layer surrounding the semiconductor solar cells is hardened by irradiation with high-energy beams after the semiconductor solar cells have been inserted, and with the degree of hardening being set specifically as a function of the layer thickness of said plastic and the energy of said beam.

2. A method as defined in claim 1, further comprising: introducing a layer of a bonding agent between said solar cells and said plastic layer and irradiating said layer of bonding agent as well as said plastic layer with high energy beams.

3. A method as defined in claim 1, wherein the thickness of the hardened plastic layer is set by metering the beam energy of the high-enery beams.

4. A method of embedding semiconductor solar cells in plastic comprising: inserting the semiconductor solar cells into the plastic material thereafter hardening the plastic material surrounding the semiconductor solar cells by irradiation with a high energy beam; and metering the energy of the high energy beam during said step of hardening so as to provide a varying degree of hardening of the plastic material as a function of the material thickness and a desired set degree of hardening of the portion of said plastic material adjacent the solar cells.

5. A method as defined in claim 4 wherein said set degree of hardness is such as to match the coefficient of expansion of said portion of said plastic material with that of said solar cells.

* * * * *